(12) United States Patent
Aihara

(10) Patent No.: US 8,821,187 B2
(45) Date of Patent: Sep. 2, 2014

(54) BOARD CONNECTOR

(75) Inventor: Tetsuya Aihara, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 224 days.

(21) Appl. No.: 13/439,045

(22) Filed: Apr. 4, 2012

(65) Prior Publication Data

US 2012/0264323 A1    Oct. 18, 2012

(30) Foreign Application Priority Data

Apr. 12, 2011 (JP) ................... 2011-088273

(51) Int. Cl.
*H01R 13/73* (2006.01)
*H01R 12/16* (2006.01)
*H05K 3/34* (2006.01)

(52) U.S. Cl.
CPC .......... *H01R 23/7063* (2013.01); *H05K 3/3405* (2013.01)
USPC .......................................... 439/566; 439/876

(58) Field of Classification Search
CPC .............. H01R 23/701–23/7063; H01R 12/57; H01R 4/02; H05K 3/3405
USPC .................... 439/83, 562, 566, 567, 874, 876
See application file for complete search history.

(56) References Cited

U.S. PATENT DOCUMENTS

| | | | |
|---|---|---|---|
| 4,027,521 A | 6/1977 | McKee et al. | |
| 6,454,599 B1 | 9/2002 | Wu | |
| 7,048,576 B2 * | 5/2006 | Nakano | 439/570 |
| 7,347,725 B2 * | 3/2008 | Sakamoto | 439/566 |
| 7,488,208 B2 * | 2/2009 | Takahashi et al. | 439/570 |
| 2008/0085616 A1 | 4/2008 | Hirai et al. | |
| 2010/0227506 A1 | 9/2010 | Kawahara | |
| 2012/0122347 A1 | 5/2012 | Aihara | |

FOREIGN PATENT DOCUMENTS

JP   2008-053025   3/2008

* cited by examiner

*Primary Examiner* — Khiem Nguyen
(74) *Attorney, Agent, or Firm* — Gerald E. Hespos; Michael J. Porco; Matthew T. Hespos

(57) ABSTRACT

A board connector (10) includes a housing (20) made of resin and in which terminal fittings (80) connectable to conductive portions of a board (90) are to be mounted. Fixing members (60) fix the housing (20) on the board (90). Each fixing member (60) is made of metal and includes a housing mounting portion (61). The housing mounting plate (61) is to be mounted on a wall surface of the housing (20) by inserting front and rear ends of the housing mounting plate (61) in mounting grooves (26) formed in the wall surface of the housing (20). The housing mounting plate (61) has a first rib (71) extending in forward and backward directions, and a second rib (72) extending in forward and backward directions and arranged to fit within the height range of the first rib (71) with respect to a height direction perpendicular to forward and backward directions.

13 Claims, 5 Drawing Sheets

BOARD CONNECTOR

BACKGROUND OF THE INVENTION

1. Field of the Invention

The invention relates to a board connector.

2. Description of the Related Art

Japanese Unexamined Patent Publication No. 2008-53025 discloses a board connector to be mounted on a surface of a printed circuit board. The board connector includes a housing made of synthetic resin and two fixing members made of metal. Terminal fittings are mounted in the housing, and ends of the terminal fittings are solder-connected to conductive portions of the board. Each fixing member has a housing mounting portion that is press-fit onto a side surface of the housing and a board mounting portion that is soldered to the surface of the board. The housing mounting portions are arranged along a height direction parallel to the side surfaces of the housing and the board mounting portions are arranged along a horizontal direction parallel to the surface of the board. Front and rear mounting grooves are formed in each side surface of the housing to extend in the height direction, and front and rear ends of the housing mounting portion are inserted and held in the mounting grooves of the housing. The housing is fixed to the board by mounting the housing mounting portions onto the housing and mounting the board mounting portions on the board.

An external force may act on the board connector in a direction to tear the connector from the board. These forces may plastically deform a fixing member with low rigidity and may reduce insertion margins of the housing mounting portions in the mounting grooves. As a result, the fixing member may not be held reliably on the housing. The fixing member may be provided with a rib for reinforcement to cope with this problem. However, one rib is insufficient and plural ribs must be provided. This leads to difficulty in ensuring a space for a necessary number of ribs on the fixing members.

The invention was completed in view of the above situation and an object thereof is to provide a board connector including a fixing member having high holding reliability and good space efficiency.

SUMMARY OF THE INVENTION

The invention relates to a board connector with a housing for receiving one or more terminal fittings connectable to one or more respective conductive portions of a board. The board connector also includes at least one fixing member that fixes the housing to the board. The fixing member includes a housing mounting portion to be mounted on a wall surface of the housing. The housing mounting portion has at least one first rib and at least one second rib that extend in forward and backward directions. The second rib is within the height range of the first rib with respect to a height direction perpendicular to forward and backward directions.

The first and second ribs extend in forward and backward directions and prevent the housing mounting portion from being deformed plastically even if an external force acts in a direction to tear the board connector from the board. Accordingly, the fixing member is held reliably on the housing. Further, the second rib is in the height range of the first rib. Thus, the housing mounting portion is not enlarged in the height direction and the space efficiency of the housing mounting portion and the fixing member is improved.

The housing preferably is made of resin and the fixing member preferably is made of metal.

Front and rear end portions of the housing mounting portion preferably are inserted and held in mounting grooves in the wall surface of the housing.

The second rib preferably is formed within the first rib.

The first and second ribs preferably project in opposite directions.

The formation of the second rib within the first rib, but with an opposite projecting direction minimizes the thickness of the housing mounting portion in the projecting direction of the first rib.

The first rib preferably projects out away from the wall surface of the housing, while the second rib preferably projects in toward the wall surface of the housing. Additionally, the second rib preferably fits within the projecting distance of the first rib. As a result, the first and second ribs will not interfere with the housing and there is no need to form a recess in the wall surface of the housing to receive the ribs.

The second rib preferably is formed in a central part of the first rib in the height direction. Thus, both ribs have excellent shape stability.

The first and second ribs preferably have substantially equal lengths in forward and backward directions. However, a projecting distance of the second rib preferably is less than a projecting of the first rib.

The first rib may have two division beads adjacent to the second rib and on substantially opposite sides of the second rib. The division beads preferably are substantially symmetrical with respect to the second rib.

The fixing member also has a board mounting portion to be mounted onto the board. At least one slit is formed in at least one intermediate position of the board mounting portion in forward and backward directions and extends also in a lower part of the housing mounting portion. The board mounting portion also may be formed with through holes and/or cutout grooves so that solder can enter the through holes and/or the cutout grooves when the board mounting portion is placed on the board.

The fixing member preferably comprises one or more locking pieces and/or sharp biting projections to fix the fixing member to the housing.

These and other objects, features and advantages of the present invention will become more apparent upon reading of the following detailed description of preferred embodiments and accompanying drawings.

DETAILED DESCRIPTION OF THE PREFERRED EMBODIMENTS

Figure 1:
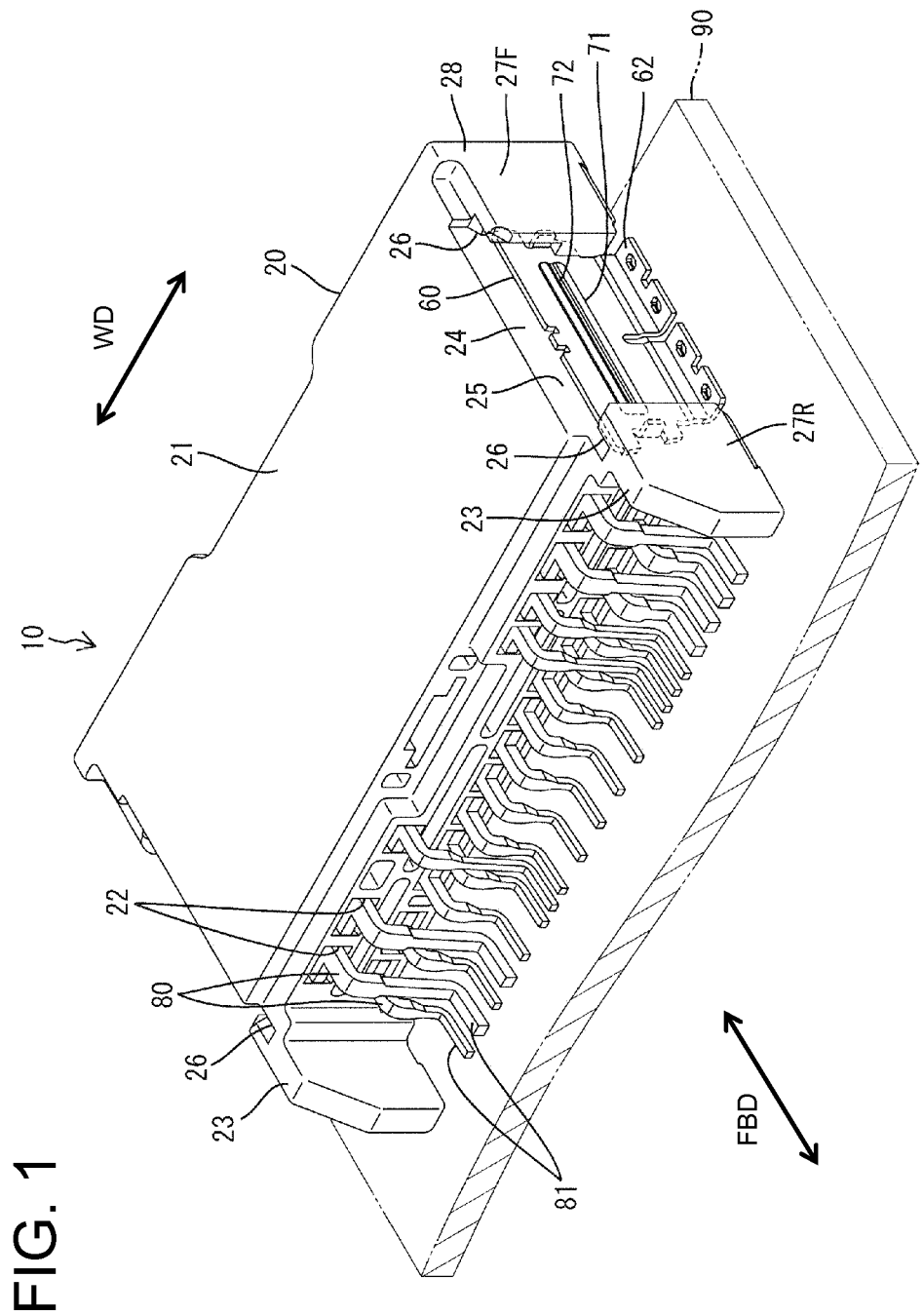
FIG. 1 is a perspective view of a board connector according to one embodiment of the present invention.

A board connector 10 according to the invention is identified by the numeral 10 in FIG. 1 and is a surface mounting type to be mounted on a surface of a printed circuit board 90. The board connector 10 includes terminal fittings 80, a housing 20 and fixing members 60. The housing 20 is connectable to an unillustrated mating connector. Note that, in the following description, an end to be connected to the mating connector is referred to as the front end concerning forward and backward directions FBD.

The housing 20 is made e.g. of synthetic resin and includes the receptacle 21 in the form of a substantially rectangular tube that is long in a width direction WD, as shown in FIG. 1. The back wall of the receptacle 21 is formed with one or more, particularly a plurality of penetrating terminal mounting holes 22 penetrate a back wall of the receptacle 21.

Each terminal fitting 80 is made of conductive metal material in the form of a substantially rectangular or polygonal bar bent substantially in an S or Z shape. An intermediate part of the terminal fitting 80 is press-fit in the back wall of the receptacle 21, as shown in FIG. 1. A front portion of the terminal fitting 80 projects into the receptacle 21 for electrically connecting to an unillustrated mating terminal fitting in the mating connector that is connected to the board connector 10. A board contact portion 81 is formed at the rear of the terminal fitting 80 and is exposed outside the receptacle 21 for contact with the surface of the board 90. The board contact portion 81 is soldered to the surface of the board 90 for electrical connection to a conductive portion of the board 90.

Protection walls 23 project back from rear ends of both side walls 28 of the receptacle 21. The rear end portions of the respective terminal fittings 80 are arranged between the protection walls 23 to achieve lateral protection.

As shown in FIG. 1, the two side walls 28 of the receptacle 21 are recessed to form mounting portions 24 for receiving the fixing members 60. The mounting portions 24 include flat mounting surfaces 25 that are aligned in a height direction HD and are recessed slightly from the outer surfaces of the front and rear end portions 27F, 27R of the side walls 28. Note that the rear end portions 27R are continuous with the protection walls 23. Steps are formed between front and rear end edges of the mounting portions 24 of each side wall 28 and the front and rear end portions 27F, 27R, and mounting grooves 26 are formed by these steps. The mounting grooves 26 define slits that penetrate in the height direction HD (vertical direction of FIG. 1 perpendicular to forward and backward directions FBD) and are open into the mounting portion 24 to face each other. Inner side surfaces of the mounting grooves 26 are flush with the mounting surface 25.

Figure 2:
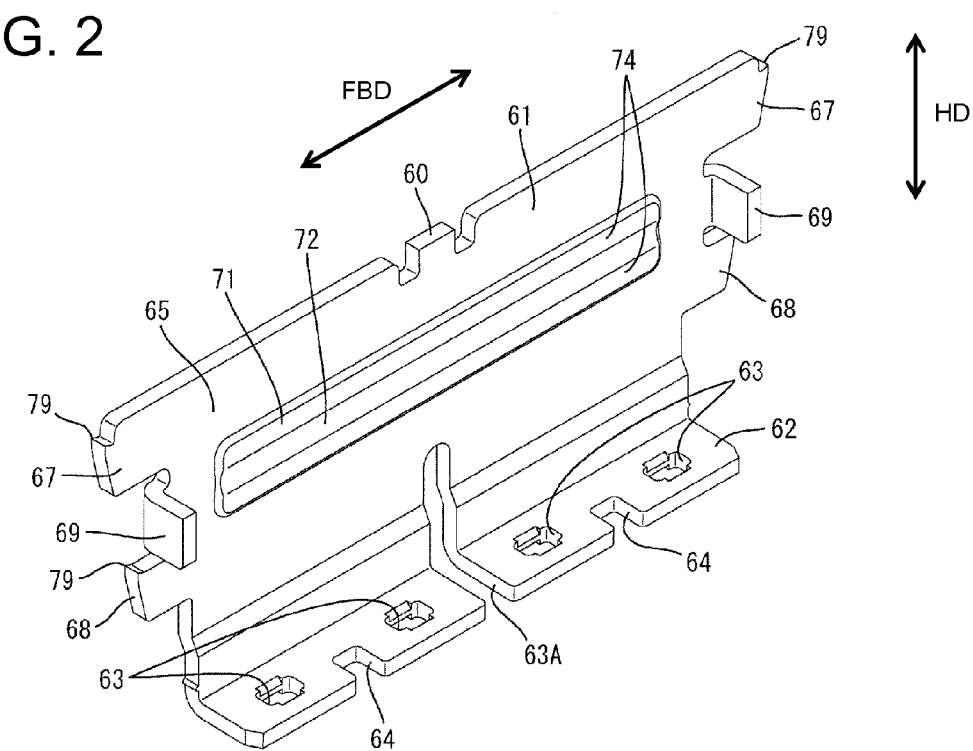
FIG. 2 is a perspective view of a fixing member.
Figure 3:
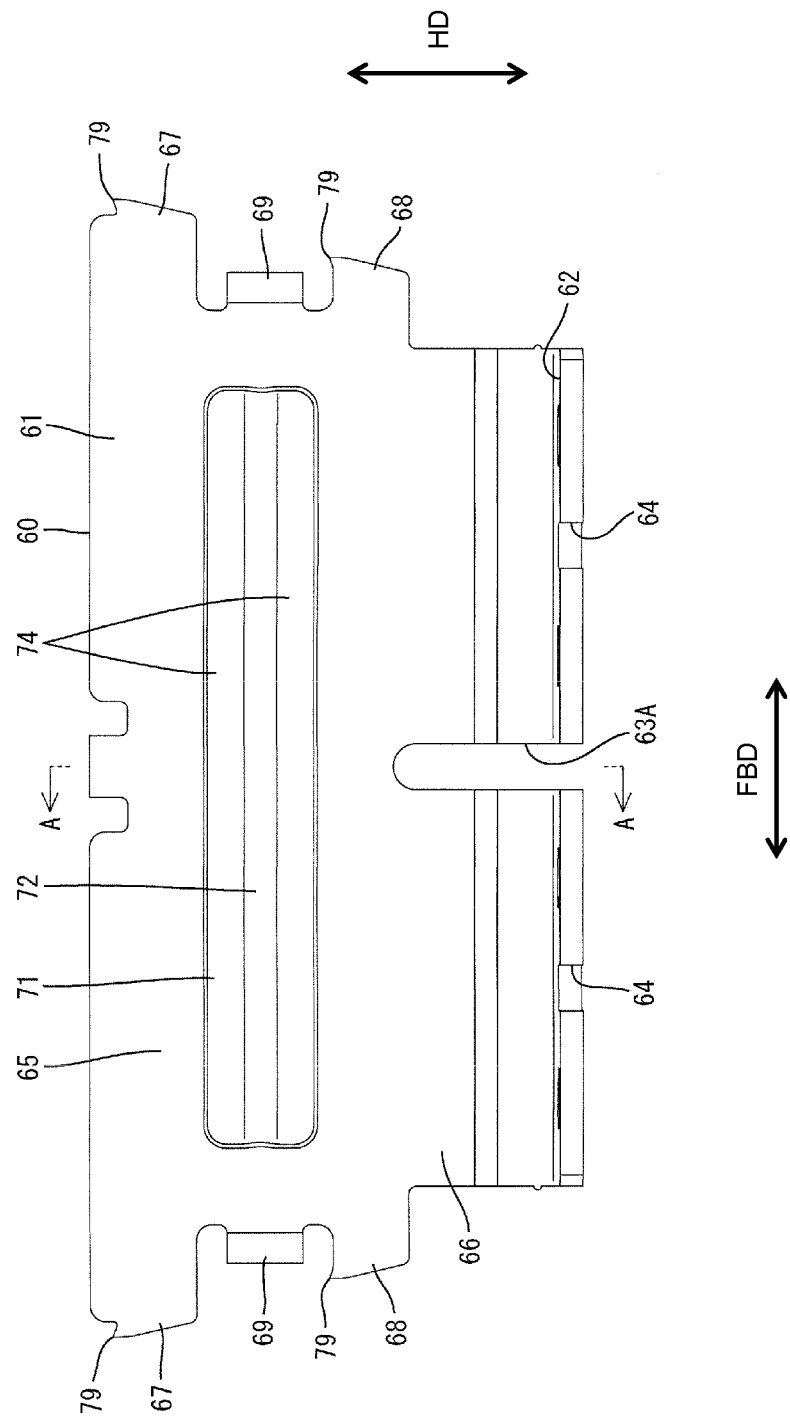
FIG. 3 is a side view of the fixing member.
Figure 4:
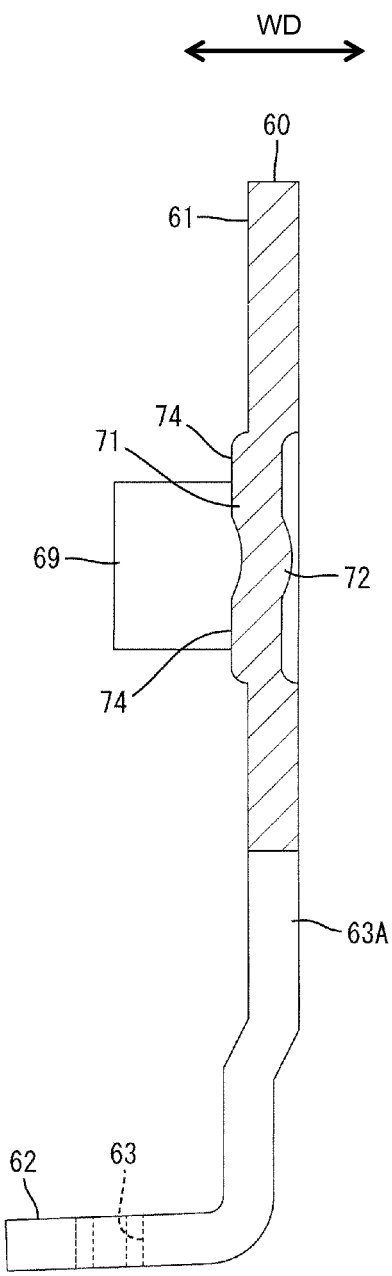
FIG. 4 is a section along A-A of FIG. 3.

A fixing member 60 is provided for each mounting portions 24 of the housing 20. Each fixing member 60 is made of a metal plate that is bent into a substantially L-shape to define a housing mounting plate 61 and a board mounting plate 62, as shown in FIGS. 2 to 4. The housing mounting plate 61 extends substantially along the height direction HD and is mounted into the mounting portion 24. The board mounting plate 62 extends substantially along the width direction WD (substantially normal to the height direction HD) and is to be mounted on the board 90.

A slit 63A is formed in a central part of the board mounting plate 62 in forward and backward directions FBD and extends into a lower part of the housing mounting plate 61. The board mounting plate 62 also has through holes 63 and cutout grooves 64 at an edge of the board mounting plate 62. Solder enters the through holes 63 and the cutout grooves 64 when the board mounting plate 62 is placed on the board 90 to increase the mounting strength of the board mounting portion 62 to the board 90.

As shown in FIG. 3, the housing mounting plate 61 includes an upper portion 65 that is a wide in forward and backward directions FBD and a lower portion 66 that is narrow in forward and backward directions FBD. The upper and lower portions 65, 66 are connected by steps. First, second and third locking pieces 67, 68 and 69 are formed on the front and rear end edges of the upper level portions 65. The first locking pieces 67 are at an upper position of the upper portion 65 and project large distances forward and backward. The second locking pieces 68 are at the lower end of the upper portion 65 and project forward and backward less than the first locking pieces 67. The third locking pieces are in a central part of the upper portion 65 and are bent substantially perpendicular to projecting directions of the first and second locking pieces 67, 68, as shown in FIGS. 2 and 4. As shown in FIG. 3, sharp biting projections 79 particularly are formed at the leading ends of the first and second locking pieces 67, 68 and project somewhat upward. The locking pieces 67, 68 and 69 are placed on the stepped parts formed on the inner surfaces of the mounting grooves 26 of the housing 20 when mounting the fixing member 60 and the biting projections 79 bite into the inner surfaces of the mounting grooves 26 to hold the fixing member 60 in the mounting portion 24.

As shown in FIGS. 3 and 4, the upper portion 65 of the housing mounting portion 61 is formed first and second ribs 71, 72 at substantially the same height as the third locking pieces 69. The first and second ribs 71, 72 extend horizontally parallel to the bend between the housing mounting plate 61 and the board mounting plate 62 and hence along forward and backward directions FBD. Front and rear ends of the first and second ribs 71, 72 are near front and rear ends of the housing mounting portion 61. The first and second ribs 71, 72 project in substantially opposite directions. More particularly, the first rib 71 bulges out away from the mounting surface 25 of the mounting portion 24 (by hammering the upper portion 65 of the housing mounting plate 61 to project out), and the second rib 72 bulges in toward the mounting surface 25 of the mounting portion 24 (by hammering the upper portion 65 of the housing mounting plate 61 to project in).

The first and second ribs 71, 72 are formed at substantially the same position in the height direction HD over the substantially their entire lengths in forward and backward directions FBD, as shown in FIG. 3. The second rib 72 is formed at a height position within the height range of the first rib 71 and hence is part the first rib 71. More specifically, the second rib 72 is formed in a central part of the first rib 71 in the height direction HD. The lengths of the first and second ribs 71 and 72 in forward and backward directions FBD are substantially equal. Additionally, as shown in FIG. 4, the projecting distance of the second rib 72 is less than the projecting distance of the first rib 71 and these projecting distances of the first and/or second ribs 71, 72 are set so that these ribs fit within the thickness range of the housing mounting plate 61.

The second rib 72 has an arcuate cross-sectional shape and the first rib 71 has a flat trapezoidal cross-sectional shape, as shown in FIG. 4. In other words, the first and second ribs 71, 72 have different cross-sectional shapes. The first rib 71 includes two division beads 74 on the opposite upper and lower sides of the second rib 72. The division beads 74 are substantially symmetrical with respect to the second rib 72.

Figure 5:
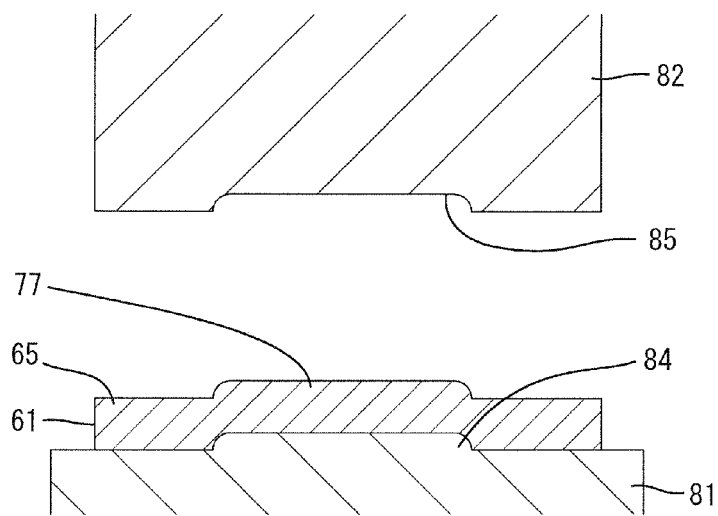
FIG. 5 is a section showing a state immediately after a first rib is formed.
Figure 6:
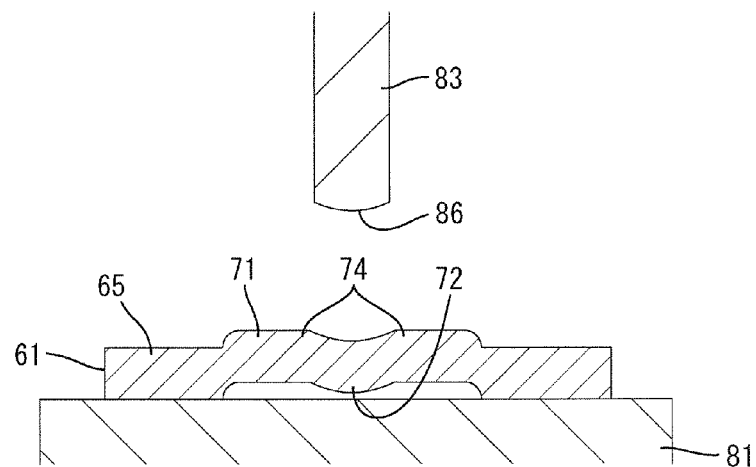
FIG. 6 is a section showing a state immediately after a second rib is formed.

Here, in forming the first and second ribs 71, 72, a lower mold 81 die, an upper mold 82 (punch) and a pressing mold 83 are prepared as shown in FIGS. 5 and 6. The lower mold 81 is formed with a projection 84, and the upper mold 82 is formed with a recess 85. The pressing mold 83 is substantially in the form of a plate thinner than the lower mold 81 and the upper mold 82, and includes a pressing surface 86 with an arcuate cross section on its leading end.

As shown in FIG. 5, the upper portion 65 of the housing mounting plate 61 is placed on the upper surface (forming surface) of the projection 84 of the lower mold 81 and, in this state, the upper mold 82 is lowered to form a first rib body 77 between the recess 85 of the upper mold 82 and the projection 84 of the lower mold 81. The upper mold 82 then is raised to be retracted from the first rib body 77. Thereafter, the pressing mold 83 is lowered to press the pressing surface 86 of the pressing mold 83 into contact with a central part of the first rib body 77 in the height direction from above. Then, as shown in FIG. 6, the outer surface of the central part of the first rib body 77 in the height direction is curved and deformed along the pressing surface 86 of the pressing mold 83 to form division beads 74 (first rib 71) and the second rib 72.

The terminal fittings 80 are mounted into the respective terminal mounting holes 22 of the housing 20 and the fixing members 60 are mounted into the mounting portions 24 of the housing 20. At this time, the front and rear end portions of the housing mounting plates 61 are inserted into the front and rear mounting grooves 26 at the side walls 28 of the housing 20 from above, and the fixing members 60 are held and retained in the mounting portions 24 of the housing 20 by the locking action of the locking pieces 67, 68 and 69 and the biting projections 79.

Subsequently, as shown in FIG. 1, the housing 20 is placed on the surface of the board 90 and the board contact portions 81 of the respective terminal fittings 80 are connected to the conductive portions of the board 90 by soldering (such as reflow-soldering). Further, the board mounting plates 62 of the fixing members 60 are connected to the board 90 by soldering (such as reflow-soldering). At this time, the front end portion of the receptacle 21 of the board connector 10 projects forward at the front edge of the board 90. Further, the unillustrated mating connector can be fit into the receptacle 21 of the housing 20 from the front to electrically connect the corresponding mating terminal fittings to the respective terminal fittings 80.

A force acts in a direction to tear or shift the board connector 10 from the board 90, for example, because an unillustrated wire drawn out from the mating connector is pulled up. Thus, there is a fear that the housing mounting plates 61 of the fixing members 60 may plastically deform to reduce engagement margins with the mounting grooves 26. However, the first and second ribs 71, 72 increase the rigidity of the housing mounting plates 61. Thus, the housing mounting plates 61 are not easily deformed and the engagement margins between the housing mounting plates 61 and the mounting grooves 26 are maintained to hold the fixing members 60 reliably on the housing 20.

Further, the second rib 72 is within the range of the first rib 71 in the height direction HD. Thus, the housing mounting plate 61 need not be enlarged in the height direction HD and the space efficiency of the housing mounting plate 61 and consequently the fixing member 60 is good. In addition, the second rib 72 is formed within the formation range of the first rib 71 and the first and second ribs 71, 72 project in opposite directions. Thus, the housing mounting plate 61 is not enlarged in the projecting direction of the first rib 71 (thickness direction of the housing mounting plate 61).

Furthermore, the first rib 71 projects out away from the mounting surface 25 of the mounting portion 24, the second rib 72 projects in toward the mounting surface 25 of the mounting portion 24 and the second rib 72 fits within the projecting distance of the first rib 71. Thus, the first and second ribs 71, 72 will not interfere with the housing 20 and no recess is needed in the mounting surface 25 of the mounting portion 24 for allowing the first and second ribs 71, 72 to escape.

Further, the second rib 72 is formed in the central part of the first rib 71 in the height direction HD so that the ribs 71, 72 have excellent shape stability.

The invention is not limited to the above described embodiment. For example, the following embodiments also are included in the scope of the invention.

Although the second rib is located at such a position as to fit within the height range of the first rib, it may be arranged before or behind the first rib.

The first and second ribs may project in substantially the same direction.

The first and second ribs may be arranged in a central part or a lower part (lower level portion) of the housing mounting portion in the height direction HD.

The lengths of the first and second ribs in forward and backward directions FBD are arbitrary and may be shorter than those of the above embodiment depending on the situation.

Contrary to the above embodiment, the first rib may have an arcuate cross-sectional shape and the second rib may have a trapezoidal cross-sectional shape.

The fixing members may be screwed, riveted or fixed in any other way to the board.

What is claimed is:

1. A board connector, comprising:
a housing in which one or more terminal fittings connectable to one or more respective conductive portions of a board are to be mounted, the housing having opposite front and rear ends spaced apart along forward and backward directions and first and second opposite side wall surfaces extending therebetween, first and second mounting grooves formed on the first and second side wall surfaces respectively and spaced from one another in the forward and backward directions, the first and second mounting grooves extending in an extending direction normal to the forward and backward directions; and
at least one fixing member to fix the housing to the board, the fixing member includes a housing mounting plate to be mounted on a wall surface of the housing, the housing mounting plate being formed with at least one first rib extending in the forward and backward directions normal to the extending direction of the grooves and projecting out away from the wall surface, and at least one second rib formed on the at least one first rib and projecting towards the wall surface, wherein a projecting height of the first rib is greater than a projection height of the second rib.

2. The board connector of claim 1, wherein the housing is made of resin and the fixing member is made of metal.

3. The board connector of claim 2, wherein front and rear end portions of the housing mounting plate are inserted and held in mounting grooves formed in the wall surface of the housing.

4. The board connector of claim 1, wherein the second rib is arranged to fit within a projecting distance of the first rib.

5. The board connector of claim 1, wherein the second rib is formed in a central part of the first rib in a height direction normal to the mounting direction of the one or more terminal fittings.

6. The board connector of claim 2, wherein lengths of the first and second ribs in the mounting direction of the one or more terminal fittings are substantially equal.

7. The board connector of claim 2, wherein the first rib includes two division beads disposed respectively on opposite sides of the second rib, the division beads being substantially symmetrical with respect to the second rib.

8. The board connector of claim 2, wherein the fixing member further comprises a board mounting plate to be mounted onto the board, at least one slit being formed in at least one intermediate position of the board mounting plate in the mounting direction of the one or more terminal fittings to extend also in a lower end portion of the housing mounting plate, the board mounting portion further being formed with at least one through hole and at least one cutout grooves so that with the board mounting plate placed on the board solder can enter the through holes and the cutout groove.

9. The board connector of claim 2, wherein the fixing member comprises at least one locking pieces and sharp biting projections to mount the fixing member to the housing.

10. A board connector, comprising:
a housing having opposite front and rear ends spaced apart along forward and backward directions, the housing being mountable to a board and having opposite first and second wall surfaces projecting from the board and extending in the forward and backward directions, two opposed mounting grooves formed in each wall surface of the housing and spaced from one another in the forward and backward directions, each of the grooves extending in an extending direction normal to the forward and backward directions; and
first and second fixing members for fixing the housing to the board, each of the fixing members including a housing mounting plate mounted in the mounting grooves of the respective wall surface of the housing, the housing mounting plate being formed with a first rib extending in the forward and backward directions normal to the extending direction of the grooves and projecting away from the respective wall surface, opposite ends of the first rib being spaced inward from parts of the mounting plate mounted in the mounting groove and a second rib extending in the forward and backward directions along the first rib and projecting toward the respective wall surface, wherein a projecting distance of the second rib toward the respective wall surface is less than a projecting distance of the first rib away from the respective wall surface.

11. The board connector of claim 10, wherein the housing is made of resin and the fixing member is made of metal.

12. The board connector of claim 11, wherein the second rib is formed symmetrically on the first rib.

13. The board connector of claim 11, wherein lengths of the first and second ribs in the forward and backward directions are substantially equal.

\* \* \* \* \*